US006876032B2

(12) United States Patent
Hsieh (10) Patent No.: US 6,876,032 B2
(45) Date of Patent: Apr. 5, 2005

(54) FLASH WITH FINGER-LIKE FLOATING GATE

(75) Inventor: Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/915,667

(22) Filed: Aug. 10, 2004

(65) Prior Publication Data

US 2005/0006697 A1 Jan. 13, 2005

Related U.S. Application Data

(62) Division of application No. 10/283,893, filed on Oct. 30, 2002, now Pat. No. 6,780,712.

(51) Int. Cl.[7] .............................................. H01L 29/788
(52) U.S. Cl. ...................................................... 257/315
(58) Field of Search .............................. 257/314–320, 257/E29.129, E29.3, E21.179, E21.422, E21.423, E21.68, E21.61, E21.687, E21.688; 438/257–267, 596, 593, FOR 203

(56) References Cited

U.S. PATENT DOCUMENTS

| 5,877,525 | A | | 3/1999 | Ahn ............................ 257/321 |
| 6,034,393 | A | | 3/2000 | Sakamoto et al. ........... 257/315 |
| 6,124,167 | A | * | 9/2000 | Kao et al. .................... 438/257 |
| 6,140,182 | A | | 10/2000 | Chen ............................ 438/259 |
| 6,153,472 | A | * | 11/2000 | Ding et al. ................... 438/264 |
| 6,153,494 | A | | 11/2000 | Hsieh et al. .................. 438/424 |
| 6,312,989 | B1 | | 11/2001 | Hsieh et al. .................. 438/257 |
| 6,326,263 | B1 | | 12/2001 | Hsieh ........................... 438/257 |
| 6,413,818 | B1 | * | 7/2002 | Huang et al. ................ 438/257 |
| 6,495,467 | B2 | | 12/2002 | Shin et al. .................... 438/706 |
| 6,518,123 | B2 | | 2/2003 | Lin ............................... 438/257 |
| 6,537,880 | B1 | * | 3/2003 | Tseng ........................... 438/260 |
| 6,576,537 | B2 | | 6/2003 | Tseng ........................... 438/594 |
| 6,642,570 | B2 | | 11/2003 | Tseng ........................... 257/315 |
| 6,677,224 | B2 | | 1/2004 | Tseng ........................... 438/593 |
| 2002/0080659 | A1 | | 6/2002 | Shin et al. .................... 365/200 |
| 2002/0094641 | A1 | | 7/2002 | Shin et al. .................... 438/257 |
| 2002/0160575 | A1 | | 10/2002 | Tseng ........................... 438/298 |

* cited by examiner

Primary Examiner—George Fourson
Assistant Examiner—Brook Kebede
(74) Attorney, Agent, or Firm—Thomas, Kayden, Horstemeyer & Risley (57) ABSTRACT

A finger-like floating gate structure in flash memory cells is disclosed. Raised isolation regions within a semiconductor region separate parallel active regions. A gate dielectric layer is disposed over the active regions. Finger-like floating gates are equally spaced along the active regions. The finger-like floating gates are comprised of a conductive base section that is disposed over the gate dielectric layer and three conductive finger sections that are in intimate electrical contact with the base section. An interlevel dielectric layer is patterned into equally spaced parallel stripes perpendicular to the active regions and each stripe is disposed over the corresponding composite floating gate for each active region. Word lines, which are composed of a third conductive layer, are parallel lines disposed over the interlevel dielectric layer and serve as control gates.

11 Claims, 8 Drawing Sheets

FLASH WITH FINGER-LIKE FLOATING GATE

CROSS-REFERENCE TO RELATED APPLICATION

This application is a divisional application of U.S. patent application Ser. No. 10/283,893 filed Oct. 30, 2002, now U.S. Pat. No. 6,780,712.

BACKGROUND OF THE INVENTION

1. Field of the Invention

The present invention relates generally to semiconductor integrated circuit technology and more particularly to memory cells used in flash EEPROMs (Electrically Erasable Programmable Read Only Memory).

2. Description of Prior Art

The efficiency of program operation in flash memory cells is dependent on the coupling ratio between a control gate and a floating gate. In flash memory cells a gate dielectric layer formed over a semiconductor region separates a floating gate from the semiconductor region. Charge is exchanged between the floating gate and the semiconductor region through the gate dielectric layer and the charging and discharging of the floating gate in this way constitute the programming and erasing operations. A control gate is separated from the floating gate by an interlevel dielectric so that the control gate is capacitively coupled to the floating gate and this coupling is utilized to control the voltage dropped across the gate dielectric. Direct exchange of charge between the control gate and floating gate is to be avoided. The coupling ratio is essentially the ratio of the voltage drop across the gate dielectric to the voltage drop across the interlevel dielectric. It is clearly advantageous to have as much of the applied potential as possible across the floating gate to semiconductor region dielectric thereby enhancing the efficiency of the programming and erase operations. Larger coupling ratios are thus more desirable. Since the ratio of the voltage drop across the gate dielectric to the voltage drop across the interlevel dielectric is equal to the inverse of the ratio of the capacitances across these layer it is beneficial to have the control gate-floating gate capacitance as large, and the floating gate-semiconductor region capacitance as small, as is practical. This must take into account that if charge is to pass through the gate dielectric it cannot be too thick and if charge is not to pass through the interlevel dielectric it cannot be too thin. These constraints hinder the setting of the thickness of the dielectric layers to achieve high coupling ratios. In many traditional flash memory cells the areas of the control gate-floating gate capacitor and the floating gate-semiconductor region capacitor are comparable and low coupling ratios are compensated by increased applied voltage. However, increased voltage can give rise to reliability problems. Also, high voltage could require excessive circuitry, which uses valuable cell area and impedes the ability of shrinking the cell.

Figure 1:
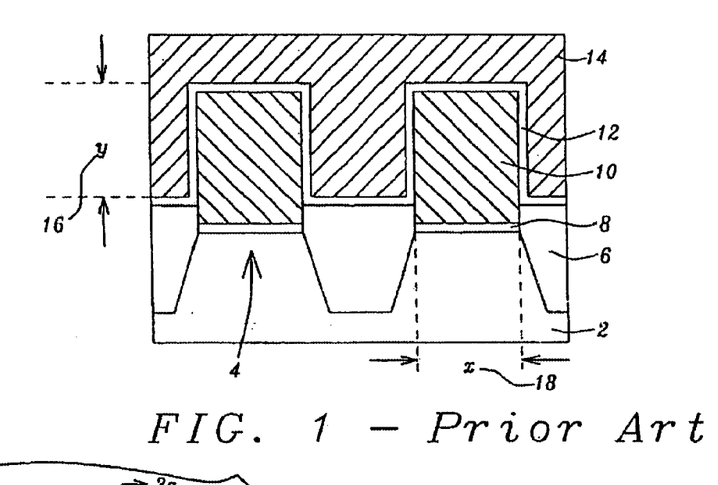
FIG. 1 shows a traditional floating gate structure

A traditional floating gate structure in which a higher control gate to floating gate coupling ratio is achieved is shown in FIG. 1. Isolation regions, 6, separate active regions, 4, of a semiconductor region, 2. A floating gate dielectric layer, 8, is formed over the active regions surfaces and conductive floating gates, 10, are disposed over the floating gate dielectric layer. A blanket interlevel dielectric layer, 12, is formed over the floating gates and isolation regions. A conductive layer, 14, over the interlevel dielectric layer forms the control gates and serves as the word lines. The height y, 16, of the floating gates provides additional area for the control gate to floating gate capacitor along the floating gate sidewalls, so this area is made to be larger than the floating gate to semiconductor region capacitor. In standard traditional structures these capacitor areas are comparable. As a result of the increased control gate to floating gate capacitor area, the coupling ratio achieved for the structure of FIG. 1 is increased as compared to standard traditional structures. The factor, by which the coupling ratio for the structure of FIG. 1 is increased over that of standard traditional structures, is given by the ratio of the control gate to floating gate capacitor areas. As can be seen from FIG. 1 the area ratio is $1+(2y/x)$, where y, 16, is the height of the floating gate and x, 18, is the width of the active region.

In the present invention a structure is disclosed in which the coupling ratio is increased by substantially increasing the area of the control gate-floating gate capacitor so that its area is much larger then the area of the floating gate-semiconductor region capacitor. This is accomplished in a method, which is an integral part of the invention, that utilizes a novel application of the spacer etch technique to fabricate a finger-like floating gate. It is an important feature of the invention that the substantial increase in the control gate-floating gate capacitor area is accomplished without any increase in cell size. With a high coupling ratio resulting from the increased area of the control gate-floating gate capacitor the thickness of the dielectric layers can be maintained as they optimally should be, the gate dielectric layer relatively thin and the interlevel dielectric layer relatively thick. In addition, the applied voltage can be low with resulting improved reliability and reduced circuitry.

Hsieh et al. U.S. Pat. No. 6,312,989 disclose a split gate flash with protruding source that contains a spacer control gate. Hsieh et al. U.S. Pat. No. 6,153,494 teach a method to increase the coupling ratio of control gate, or word line, to floating gate by lateral coupling in stacked-gate flash. U.S. Pat. No. 6,034,393 to Sakamoto et al. shows a nonvolatile semiconductor memory device with trench isolation. U.S. Pat. No. 6,140,182 disclose a nonvolatile memory device with raised isolation regions with increased control gate to floating gate coupling ratio.

SUMMARY OF THE INVENTION

It is a primary objective of the invention to provide floating gate structures in flash memory cells with increased control gate to floating gate coupling ratio. Another primary objective of the invention is to provide floating gate structures in flash memory cells with increased control gate to floating gate coupling ratio that is achieved without increase of cell size. It is another primary objective of the invention to provide floating gate structures in flash memory cells that require lower control gate applied voltage and thus possess increased reliability. Yet another primary objective is to provide floating gate structures in flash memory cells whose decrease in cell size is not limited by the circuitry required to deliver the high voltage needed for traditional programming and erasing processes. It is yet another primary objective of the invention to provide a method to fabricate floating gate structures in flash memory cells with increased control gate to floating gate coupling ratio. It is yet another primary objective of the invention to provide a method to fabricate floating gate structures in flash memory cells with increased control gate to floating gate coupling ratio that is achieved without increase of cell size. It is yet another primary objective of the invention to provide a method to fabricate floating gate structures resulting in flash memory cells that require lower top gate voltage and thus possesses increased reliability. Yet another primary objective is to provide a method to fabricate floating gate structures resulting in flash memory cells whose cell decrease is not limited by the circuitry required to deliver the high voltage needed for traditional programming and erasing processes.

These objectives are achieved in the invention by finger-like floating gate structures that deviate from the structures of traditional flash memory cells. In preferred embodiments of the invention the finger-like floating gate is a composite structure. In a novel application of insulator spacer processes, a floating gate is fabricated, from two conductive layers, having a planar interface with a semiconductor region across a gate dielectric layer and a three-finger-like interface across an interlevel dielectric layer with a control gate. The planar bottom surface of the finger-like floating gate is disposed over a gate dielectric layer formed over a planar surface of a semiconductor region. An interlevel dielectric layer is formed over the surface of the three fingers and the control gate is disposed over the interlevel dielectric layer. The area of the sidewalls of the finger-like like part of the floating gate can be very much larger than the area of the planar bottom resulting in a significant increase of the coupling ratio over that of traditional structures. It is noteworthy that the increased area is achieved with no expenditure of cell area. With an increased coupling ratio applied voltages can be lower with a consequential improvement in reliability and with no need for circuitry to support high voltage.

A finger-like floating gate structure in flash memory cells is disclosed. Raised isolation regions within a semiconductor region separate parallel active regions. A gate dielectric layer is disposed over the active regions. Finger-like floating gates are equally spaced along the active regions. The finger-like floating gates are comprised of a conductive base section that is disposed over the gate dielectric layer and three conductive finger sections that are in intimate electrical contact with the base section. An interlevel dielectric layer is patterned into equally spaced parallel stripes perpendicular to the active regions and each stripe is disposed over the corresponding composite floating gate for each active region. Word lines, which are composed of a third conductive layer, are parallel lines disposed over the interlevel dielectric layer and serve as control gates. A detailed description is given in the following embodiments with reference to the accompanying drawings.

BRIEF DESCRIPTION OF THE DRAWINGS

In the accompanying drawing forming a material part of this description, there is shown.

DESCRIPTION OF THE PREFERRED EMBODIMENTS

Figure 2A:
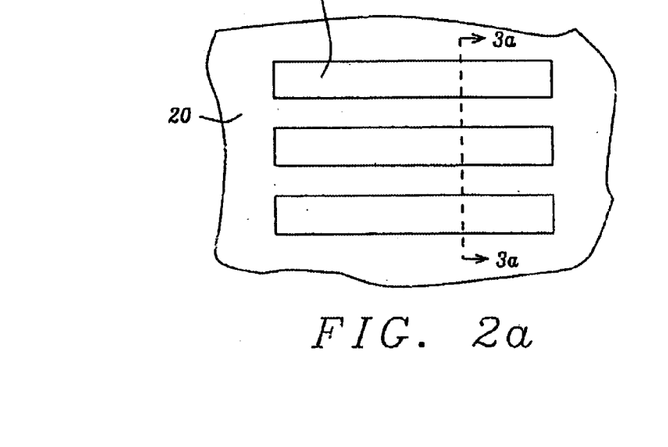
FIGS. 2a–2i show top views depicting a method of forming floating gate structures, according to the invention, in flash memory cells.
Figure 2B:
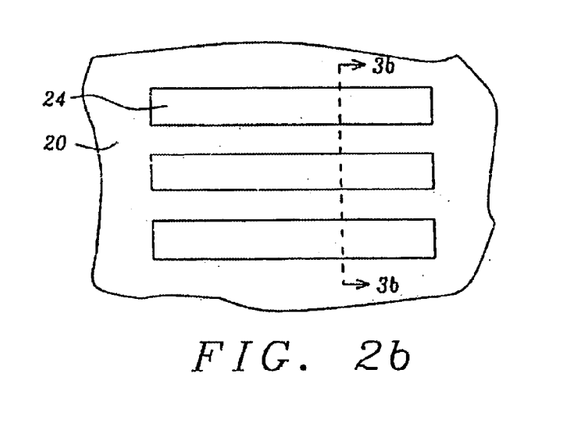
Figure 2C:
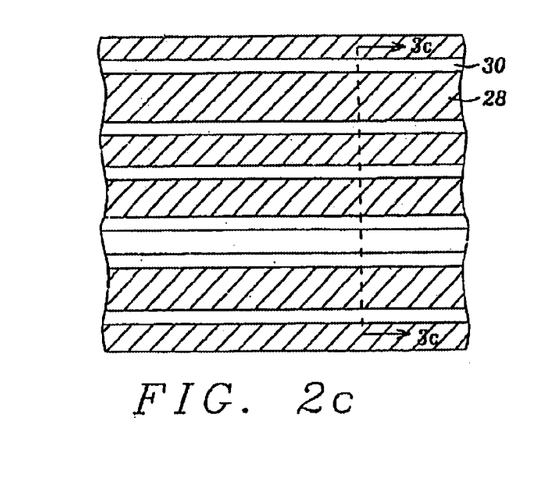
Figure 2D:
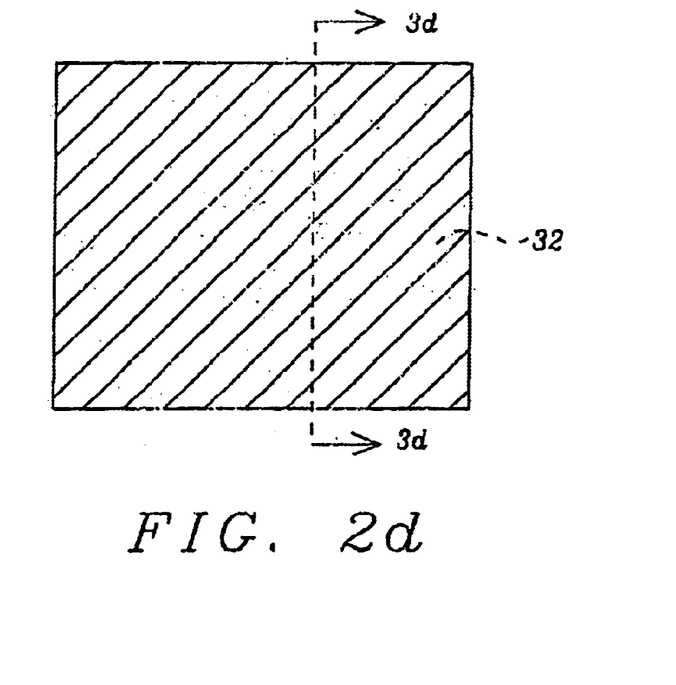
Figure 2E:
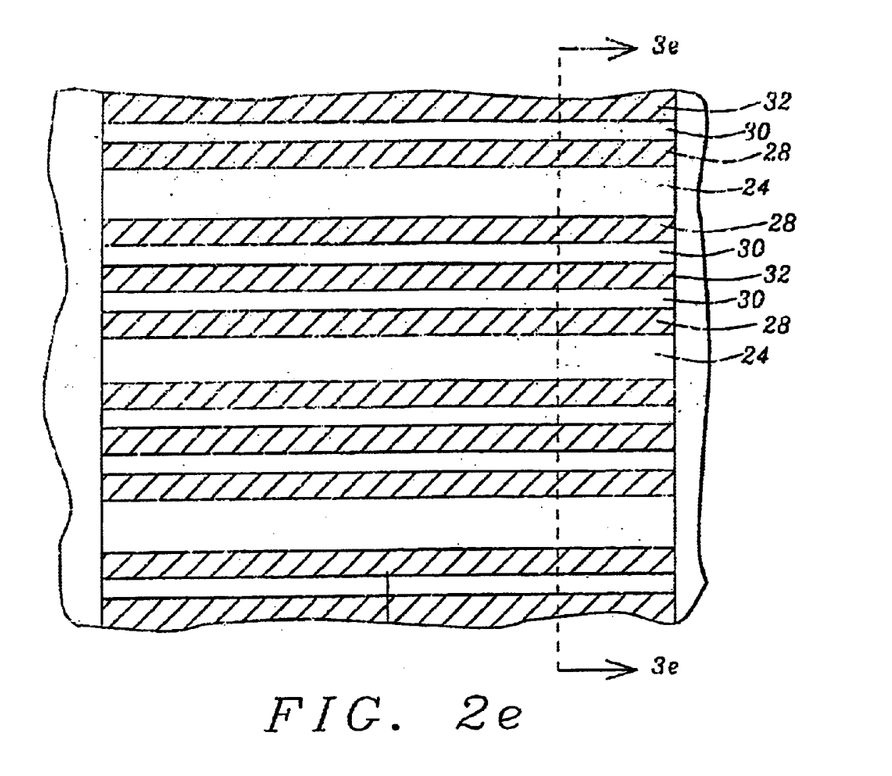
Figure 2F:
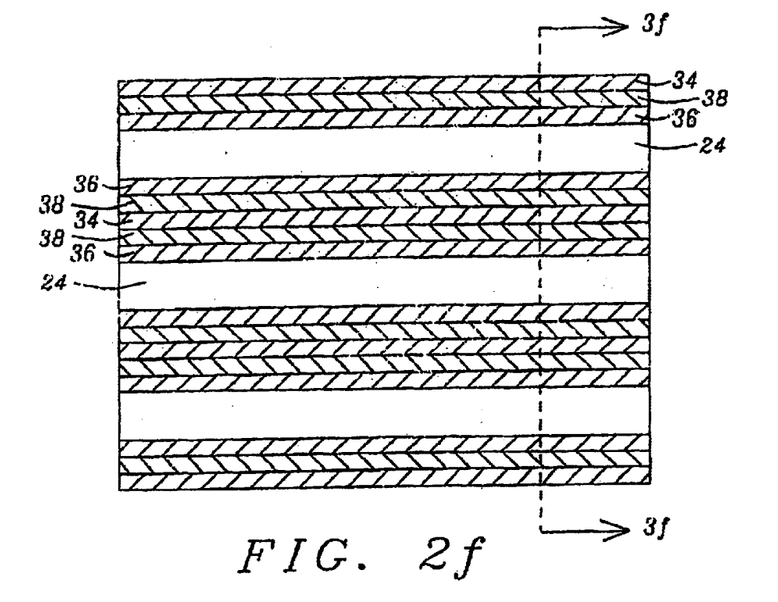
Figure 2G:
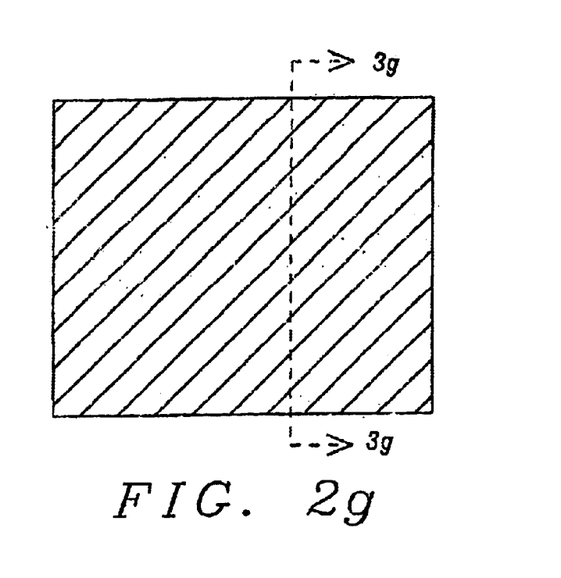
Figure 2H:
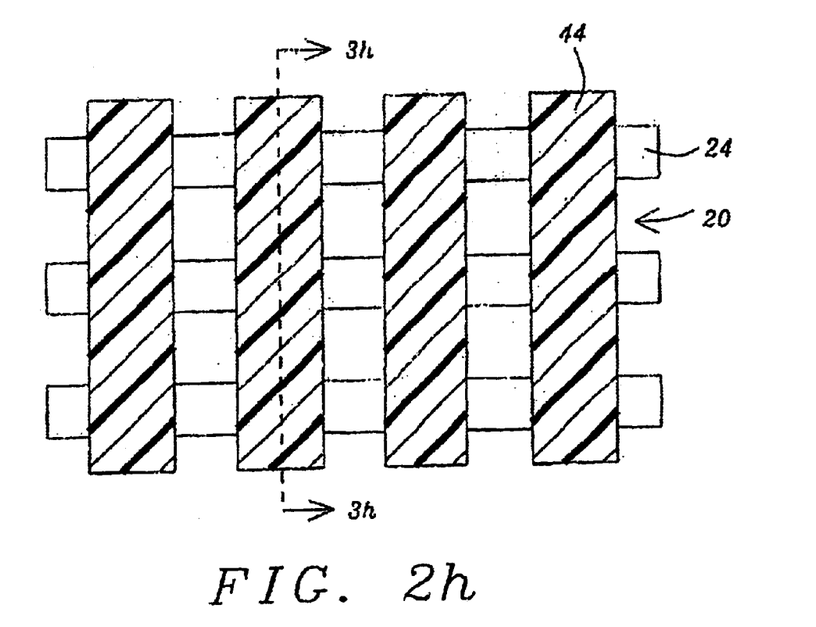
Figure 2I:
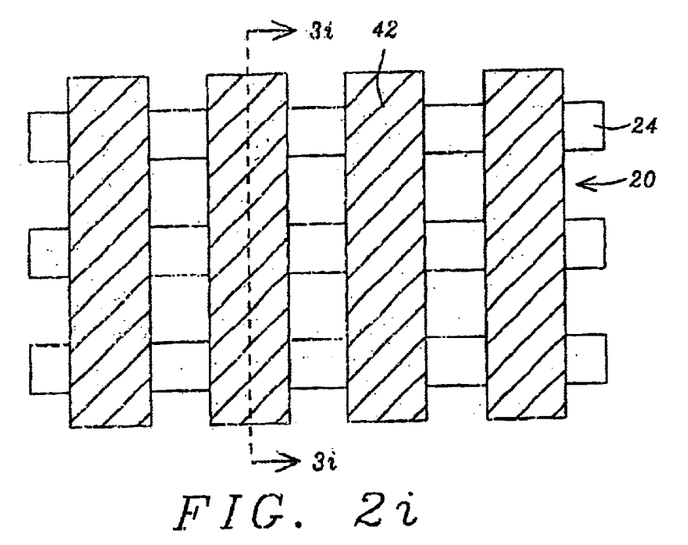
Figure 3A:
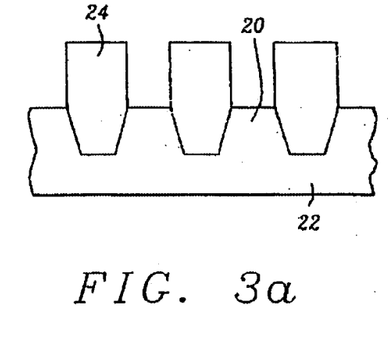
FIGS. 3a–3i show cross-sectional views depicting a method of forming floating gate structures, according to the invention, in flash memory cells.
Figure 3B:
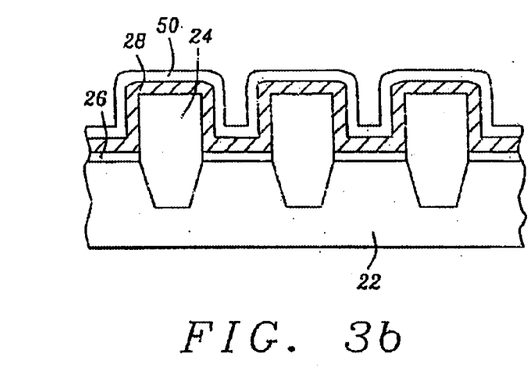
Figure 3C:
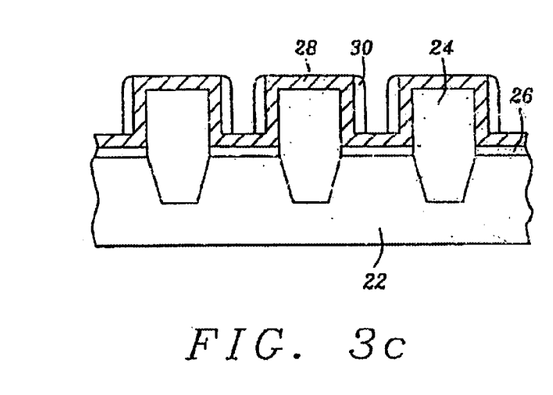
Figure 3D:
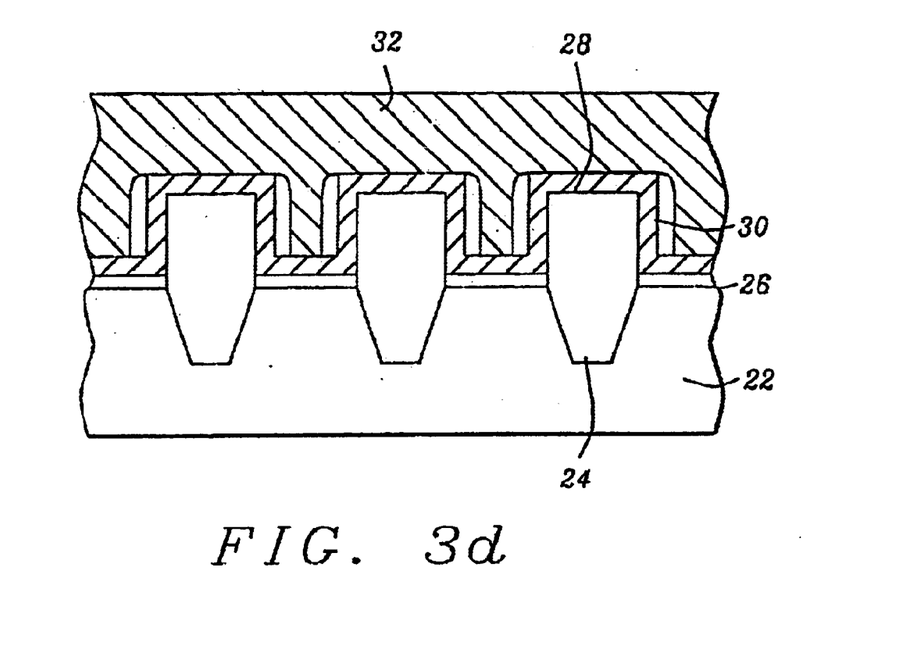
Figure 3E:
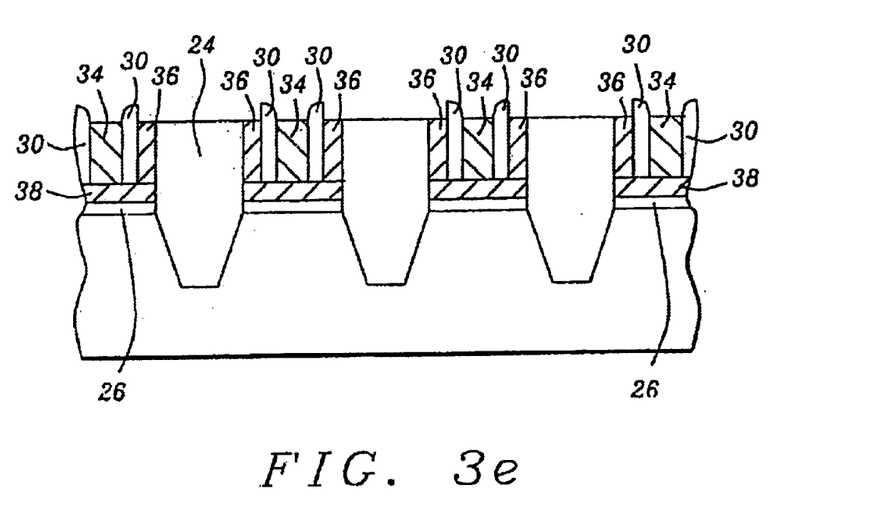
Figure 3F:
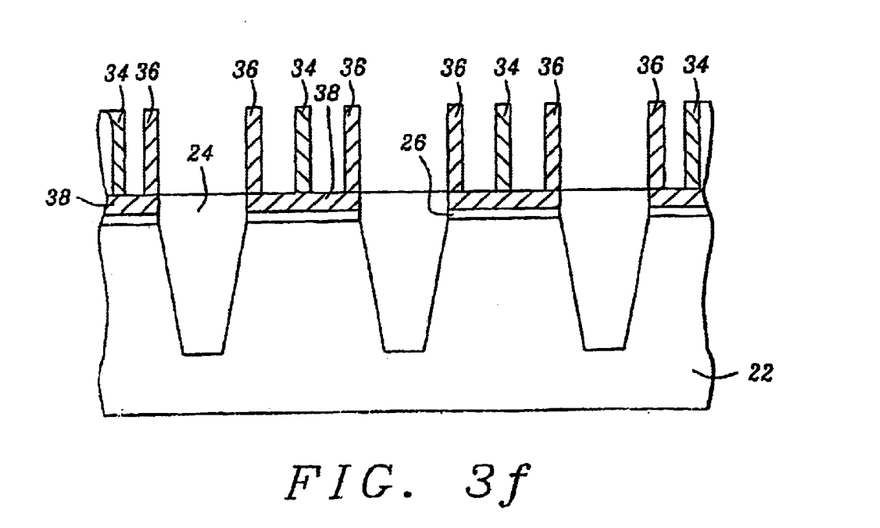
Figure 3G:
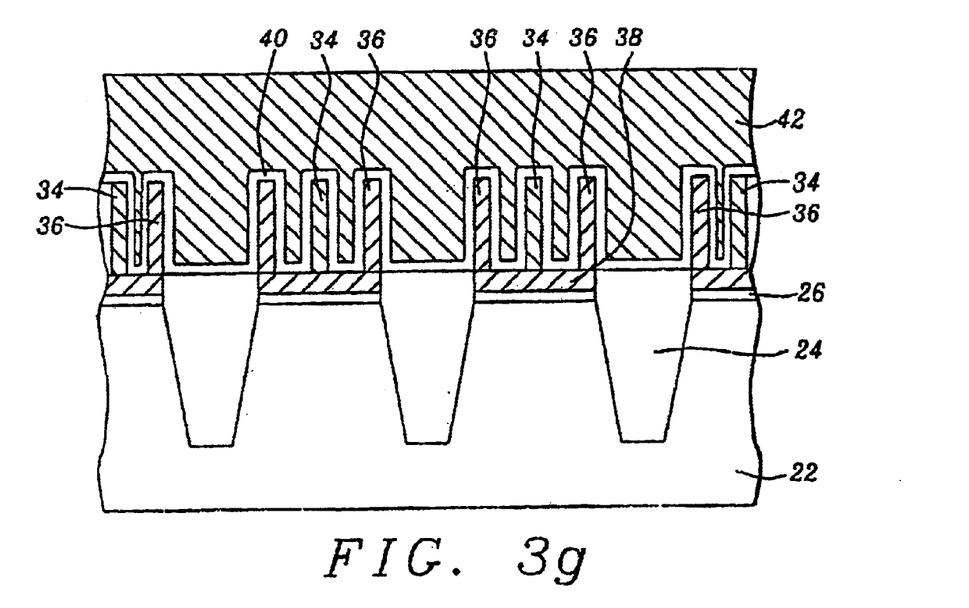
Figure 3H:
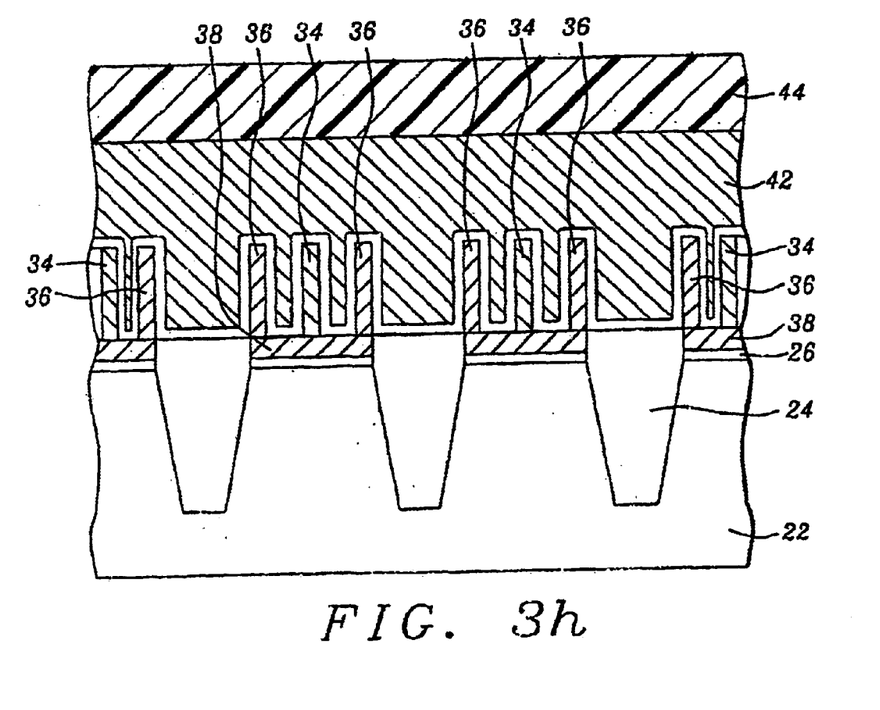

Preferred embodiments of the invention are well described with the aid of FIGS. 2a–2i and 3a–3i. A method of fabricating a finger-like floating gate is presented in FIGS. 2a–2i, where top views are presented at successive stages of the process and in FIGS. 3a–3i, which show the corresponding cross-sectional views. As shown in FIGS. 2a and 3a, active regions, 20, are defined on a semiconductor region, 22, which preferably is a p-type silicon region, using raised isolation regions, 24, such as shallow trench isolation, STI, regions. A floating gate dielectric layer, 26, is then formed over the active regions to a thickness of about 100 Angstroms. Preferably the floating gate dielectric layer is a thermally grown oxide. The gate dielectric layer serves as the dielectric layer between the semiconductor region and the floating gate. Deposition of a blanket first conductive layer, 28, follows, over the gate dielectric layer, 26, that covers the active regions and over the top and exposed sidewalls of the raised isolation regions, 24. Preferably the first conductive layer is a first polysilicon layer deposited to a depth of about 300 Angstroms. The first conductive layer will be fashioned to form base sections, 38 and end-fingers, 36, of finger-like floating gates. An insulator layer, 50, is then formed over the first conductive layer. The insulator layer is preferably a Teos oxide layer deposited to a depth of about 300 Angstroms. At this stage in the process the structure is as depicted in FIGS. 2b and 3b. A spacer etch is now performed on the insulator layer to form insulator spacers, 30, disposed along the sidewalls of the first conductive layer, as shown in FIGS. 2c and 3c. Except for the insulator spacers, all of the insulator layer should be removed from over the first conductive layer. Next a blanket second conductive layer, 32, is deposited over the exposed first conductive layer and the insulator spacers. Preferably the second conductive layer is a second polysilicon layer deposited to a depth of about 1500 Angstroms. It is necessary that the second conductive layer makes intimate electrical contact with the underlying first conductive layer, which is why it is important that in the insulator spacer etch all of the insulator layer, except for the insulator spacers, be removed from over the first conductive layer. The second conductive layer will be fashioned to form middle fingers, 34, of finger-like floating gates that make contact with first conductive layer base sections, 38. To this end the second conducting layer is now reduced to the level of the top of the raised isolation regions to achieve the structure shown in FIGS. 2e and 3e. First conductive layer and second conductive layer are completely removed from above the isolation regions so that the floating gates are self-aligned to the active regions. This reduction of the second conductive layer can be achieved utilizing a variety of processes. The particular profile shown in FIG. 3e is achieved when etch back of the second conductive layer is the process used. In this case a high selectivity for the second conductive layer to the isolation regions and insulator spacers is required. Chemical-mechanical polishing (CMP) is another example of a process that can achieve the reduction of the second conductive layer. For CMP the resulting surface profile is flatter. It remains to remove the insulator spacers, reduce the raised isolation regions to about the level of the top of the floating gate base sections, form an interlevel dielectric layer and to form control gates that also serve as word lines. Removal of the insulator spacers and reduction of the raised isolation region can be accomplished by etching. In most preferred embodiments of the invention the isolation region is an oxide region and the insulator spacers are Teos oxide so that they can be etched simultaneously, by using HF or BEO for example. An interlevel dielectric layer, 40, is now formed that serves as the dielectric layer between the floating gates and control gates, to be subsequently formed. The interlevel dielectric layer is preferably an ONO layer with the depths of the layers being about 60 Angstroms for each of the layers, i.e., the bottom oxide, nitride and upper oxide layers. A third conductive layer, 42, is deposited that preferably is a third polysilicon layer deposited to a depth of about 1000 Angstroms. The third conductive layer is patterned to serve as control gates and as parallel word lines running perpendicular to the active regions, as shown in FIGS. 2h and 3h. Forming a photoresist layer, 44, patterning the photoresist layer, as shown in FIGS. 2h and 3h, and etching the third conductive layer can, for example, accomplish this patterning. Before removing the patterned photoresist, the exposed interlevel dielectric layer, second conductive layer and first conductive layer are etched. Thus none of the interlevel dielectric layer, second conductive layer and first conductive layer remains except that which is disposed under the third conductive layer lines. This completes the fabrication of the finger-like floating gate, shown in FIGS. 2i and 3i, according to most preferred embodiments of the invention.

These objectives are achieved in the invention by finger-like floating gate structures that deviate from the structures of traditional flash memory cells. In preferred embodiments of the invention the finger-like floating gate is a composite structure. In a novel application of insulator spacer processes, a floating gate is fabricated, from two conductive layers, having a planar interface with a semiconductor region across a gate dielectric layer and a three-finger-like interface across an interlevel dielectric layer with a control gate. The planar base section of the finger-like floating gate is disposed over a gate dielectric layer formed over a planar surface of a semiconductor region. An interlevel dielectric layer is formed over the surface of the three fingers and the control gate is disposed over the interlevel dielectric layer. The area of the sidewalls of the finger-like like part of the floating gate can be very much larger than the area of the planar bottom resulting in a significant increase of the coupling ratio over that of traditional structures. It is noteworthy that the increased area is achieved with no expenditure of cell area. With an increased coupling ratio applied voltages can be lower with a consequential improvement in reliability and with no need for circuitry to support high voltage.

Figure 3I:
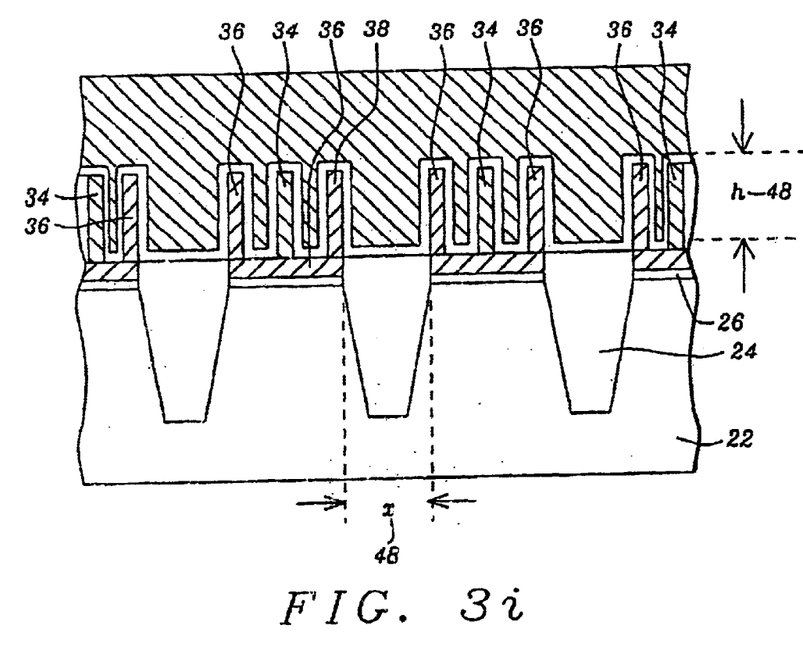

Referring to FIG. 3i, the increased control gate to floating gate coupling ratio achieved for preferred embodiments of the invention is apparent. This coupling ratio is the ratio of the voltage drop across the gate dielectric layer, 26, to the voltage drop across the interlevel dielectric layer, 40, which is also the ratio of the capacitance of the control gate to floating gate capacitor to the capacitance of the floating gate to semiconductor region capacitor. The factor, by which the coupling ratio for the structure of the invention is increased over that of a standard traditional structure, in which the capacitance areas are equal, is given by the ratio of the capacitor areas. As can be seen from FIG. 3i the area ratio is close to 1+(6h/x), where h, 46, is the height of the fingers and x, 48, is the width of the active region. Thus, the larger is h the larger is the increase in coupling ratio and the smaller is x the larger is the increase in coupling ratio. As feature sizes decrease, that is as x decreases, composite floating gate structures of the invention of the same height, h, will give rise to greater increase in the coupling ratio. For example, for (0.25, 0.5, 1, 2) being a set of values of h/x the corresponding values of 1+(6h/x) are the set (2.5, 4, 7, 13) indicating a large increase in the coupling ratio. By contrast, for the same set (0.25, 0.5, 1, 2) of values for y/x, the values of 1+(2y/x), appropriate to the structure of FIG. 1, are (1.5, 2, 3, 5), which are significantly smaller than that obtained for a finger-like floating gate structure of the invention.

While the invention has been particularly shown and described with reference to the preferred embodiments thereof, it will be understood by those skilled in the art that various changes in form and detail may be made without departing from the spirit and scope of the invention.

What is claimed is:

1. A finger-like floating gate structure in flash memory cells comprising:

a semiconductor region within a substrate extending to a surface;

parallel active regions separated by isolation regions within said semiconductor region;

a gate dielectric layer disposed over said active regions;

finger-like floating gates that are equally spaced along said active regions, said finger-like floating gates being comprised of a conductive base section that is disposed over said gate dielectric layer and three conductive finger sections in intimate electrical contact with said base section;

an interlevel dielectric layer that constitutes equally spaced parallel stripes perpendicular to said active regions, where each said stripe is disposed over a corresponding finger-like floating gate for each active region;

word lines that are parallel lines disposed over said interlevel dielectric layer and that serve as control gates.

2. The structure of claim 1 wherein said semiconductor region is a silicon region.

3. The structure of claim 1 wherein said isolation regions are shallow trench isolation regions.

4. The structure of claim 1 wherein said gate dielectric layer is an oxide layer.

5. The structure of claim 1 wherein said gate dielectric layer is a thermally grown oxide layer of thickness about 100 Angstroms.

6. The structure of claim 1 wherein said conductive base section of finger-like floating gate is composed of polysilicon.

7. The structure of claim 1 wherein said conductive base section and end fingers of said conductive finger sections are composed from a first conductive layer and middle finger of said conductive finger sections is composed of a second conductive layer.

8. The structure of claim 1 wherein said conductive finger sections of finger-like floating gate are composed of polysilicon.

9. The structure of claim 1 wherein said interlevel dielectric layer is a composite dielectric layer.

10. The structure of claim 1 wherein said interlevel dielectric layer is an ONO layer with the thickness of each of the component layers, the bottom oxide layer, nitride layer and top oxide layer, is about 60 Angstroms.

11. The structure of claim 1 wherein said third conductive layer is a polysilicon layer deposited to a thickness of about 2000 Angstroms.

* * * * *